US012764862B2

(12) United States Patent
Greenburg et al.

(10) Patent No.: US 12,764,862 B2
(45) Date of Patent: Oct. 13, 2026

(54) EMBEDDING OF A CIRCUIT OF ELECTRONIC COMPONENTS IN A BENDABLE SECTION OF AN ELONGATED FLEXIBLE DEVICE

(71) Applicant: Magnisity Ltd., Hod-HaSharon (IL)

(72) Inventors: Benjamin Greenburg, Hod-HaSharon (IL); Dror Gardosh, Rishon LeTsiyon (IL); Ron Barak, Tel-Aviv (IL); Igi Brigman, Petah Tikva (IL); Efrat Levy, Petah Tikva (IL)

(73) Assignee: Magnisity Ltd., Hod-HaSharon (IL)

( * ) Notice: Subject to any disclaimer, the term of this patent is extended or adjusted under 35 U.S.C. 154(b) by 233 days.

(21) Appl. No.: 18/652,928

(22) Filed: May 2, 2024

(65) Prior Publication Data

US 2024/0373555 A1 Nov. 7, 2024

Related U.S. Application Data

(60) Provisional application No. 63/536,465, filed on Sep. 4, 2023, provisional application No. 63/463,990, filed on May 4, 2023, provisional application No. 63/463,976, filed on May 4, 2023.

(51) Int. Cl.

| | |
|---|---|
| ***H05K 1/11*** | (2006.01) |
| ***H05K 1/02*** | (2006.01) |
| ***H05K 1/14*** | (2006.01) |
| ***H05K 1/189*** | (2026.01) |

(52) U.S. Cl.

CPC ............. *H05K 1/118* (2013.01); *H05K 1/028* (2013.01); *H05K 1/148* (2013.01); *H05K 1/189* (2013.01); *H05K 2201/10151* (2013.01); *H05K 2201/10734* (2013.01)

(58) Field of Classification Search

CPC ........ H05K 1/118; H05K 1/028; H05K 1/148; H05K 1/189; H05K 2201/10151; H05K 2201/10734

USPC .......................................................... 361/749

See application file for complete search history.

(56) References Cited

U.S. PATENT DOCUMENTS

| | | | | |
|---|---|---|---|---|
| 7,618,260 B2 * | 11/2009 | Daniel | ................. | A44C 5/0007 439/528 |
| 11,921,471 B2 * | 3/2024 | Bailey | .................... | G04G 17/04 |
| 2014/0078694 A1 * | 3/2014 | Wissmar | ................ | A61B 5/681 361/749 |

FOREIGN PATENT DOCUMENTS

| | | |
|---|---|---|
| WO | WO 2014/116961 | 7/2014 |
| WO | WO 2024/079735 | 4/2024 |

OTHER PUBLICATIONS

International Preliminary Report on Patentability Dated Apr. 24, 2025 From the International Bureau of WIPO Re. Application No. PCT/IL2023/051072 (7 Pages).

(Continued)

*Primary Examiner* — Binh B Tran

(57) ABSTRACT

A method for assembling an elongated device includes: making a standalone subassembly by assembling across a bendable section a FPC having at least one sensor attached therein; and threading the standalone subassembly in an outer tube. An elongated device, comprising: a plurality of serially connected links, forming a bendable section; and a flexible printed circuit (FPC) having at least one sensor attached therein, the FPC is assembled on the links across the bendable section.

27 Claims, 6 Drawing Sheets

(56) References Cited

OTHER PUBLICATIONS

International Search Report and the Written Opinion Dated Feb. 4, 2024 From the International Searching Authority Re. Application No. PCT/IL2023/051072 (11 Pages).

* cited by examiner

EMBEDDING OF A CIRCUIT OF ELECTRONIC COMPONENTS IN A BENDABLE SECTION OF AN ELONGATED FLEXIBLE DEVICE

RELATED APPLICATIONS

This application claims the benefit of priority under 35 USC § 119 (e) of U.S. Provisional Patent Application No. 63/536,465 filed on Sep. 4, 2023, U.S. Provisional Patent Application No. 63/463,990 filed on May 4, 2023 and of U.S. Provisional Patent Application No. 63/463,976 filed on May 4, 2023. The contents of which the above applications are all incorporated by reference as if fully set forth herein in their entirety.

FIELD AND BACKGROUND OF THE INVENTION

The present disclosure, in some embodiments thereof, relates to Flexible Printed Circuits and, more particularly, but not exclusively, to Flexible Printed Circuits for elongated devices.

Certain medical devices exist which combine electronics inside the devices. For example, many endoscopes exist which contain an electrical image sensor at the endoscope's tip, which is usually accompanied by one or more Light Emitting Diodes (LED). In this case, for example, the image sensor and LEDs are usually powered by a power source located externally to the endoscope and residing in a host station and connected to the endoscope using electrical conductors such as isolated electrical wires inside an electrical cable, and the sensor images are streamed to a host station using one or more electrical conductors, such as isolated shielded electrical wires.

Other types of devices exist which make use of passive electronics. For example, in a traditional Electromagnetic (EM) based tracking system, an EM coil-based sensor may comprise an ultra-thin enameled copper wire wrapped around a small magnetic core (for example, ferrite) and placed at the tip of a tracked EM catheter. The wire at its two ends may then be extended in a twisted-pair fashion back to a connected host system, as a differential signal. Usually, each EM coil requires 2 differential wires. A standard 3D EM coil-based sensor consists for example of 3 perpendicular coils, which amounts to 6 wires. For a standard multi-sensor EM application, the number of wires grows linearly with the number of EM sensors in the device.

There exist other types of devices and tools which combine electronic components and sensors, such as but not limited to: pressure sensors, strain sensors, force sensors, imaging sensors, etc. Such devices and tools, for example in the medical field, may be: endoluminal ultrasound devices (such as REBUS, IVUS); other endoluminal imaging (such as OCT and spectroscopy devices); ablation devices (such as RF probes, Microwave probes, cryoablation devices); electrical clot and foreign-object retrieval; flexible endoluminal surgical tools; histotripsy and other types of therapeutic ultrasound devices, electrical cauterization. Most electrical devices and tools require electrical powering, connectivity, and hosting of electrical components inside the devices.

Additional background art includes U.S. Pat. No. 11,712,309 disclosing an EM shape sensor which consists of a sensor-array made of multiple discrete digital 3D magnetometers assembled on a Flexible Printed Circuit (FPC). The sensor-array may be embedded in a manual or robotic endoscope (or other tubular device) to enable EM shape sensing of that endoscope.

SUMMARY OF THE INVENTION

According to an aspect of some embodiments the present disclosure, there is provided a method for assembling an elongated device, comprising: making a standalone subassembly by assembling across a bendable section a FPC having at least one sensor attached therein; and threading the standalone subassembly in an outer tube.

According to another aspect of some embodiments the present disclosure, there is provided an elongated device, comprising: a standalone subassembly comprising: a bendable section; a flexible printed circuit (FPC) having at least one sensor attached therein, the FPC is assembled across the bendable section; and an outer tube in which the standalone subassembly is threaded.

According to some embodiments of the invention, the bendable section includes a window to allow the sensor to be inserted inwardly into the bendable section.

According to some embodiments of the invention, the bendable section includes serially connected links, wherein the FPC is assembled on the links across the bendable section.

According to some embodiments of the invention, the bendable section consists of links serially connected by hinges.

According to some embodiments of the invention, the FPC is wrapped on the bendable section so that the at least one sensor is positioned on a corresponding link.

According to some embodiments of the invention, the FPC include a plurality of sensors along the FPC, and the FPC is installed on the bendable section so that the plurality of sensors are aligned on a straight line.

According to some embodiments of the invention, the FPC include a plurality of sensors along the FPC, and the FPC is installed on the bendable section so that the plurality of sensors are inserted to windows in of the bendable section.

According to some embodiments of the invention, the links of the bendable section are formed by removing material from a tube.

According to some embodiments of the invention, a pitch of winding of the FPC is a link length or a multiple of a link length.

According to some embodiments of the invention, the FPC comprises conductors that pass over hinges between the links.

According to some embodiments of the invention, the FPC has a plurality of sensors that are positioned in an offset from a plain of hinges between the links.

According to some embodiments of the invention, hinges between the links alternate between perpendicular plains.

According to some embodiments of the invention, the FPC has a plurality of sensors that consist of IC sensors.

According to some embodiments of the invention, an IC sensor is soldered to the FPC and then grinded to reduce its roof material.

According to some embodiments of the invention, a height of an IC sensor is reduced by heating.

According to another aspect of some embodiments the present disclosure, there is provided an elongated device, comprising: a plurality of serially connected links, forming a bendable section; and a flexible printed circuit (FPC)

having at least one sensor attached therein, the FPC is assembled on the links across the bendable section.

According to some embodiments of the invention, the links include a window to allow the sensor to be inserted inwardly into a corresponding link.

According to some embodiments of the invention, the links are serially connected by hinges.

According to some embodiments of the invention, the FPC is wrapped on the bendable section so that the at least one sensor is positioned on a corresponding link.

According to some embodiments of the invention, the FPC include a plurality of sensors along the FPC, and the FPC is installed on the bendable section so that the plurality of sensors are aligned on a straight line.

According to some embodiments of the invention, the FPC include a plurality of sensors along the FPC, and the FPC is installed on the bendable section so that the plurality of sensors are inserted to windows in corresponding links of the bendable section.

According to some embodiments of the invention, the links of the bendable section are formed by removing material from a tube.

According to some embodiments of the invention, a pitch of winding of the FPC is a link length or a multiple of a link length.

According to some embodiments of the invention, the FPC comprises conductors that pass over hinges between the links.

According to some embodiments of the invention, the FPC has a plurality of sensors that are positioned in an offset from a plain of hinges between the links.

According to some embodiments of the invention, hinges between the links alternate between perpendicular plains.

According to some embodiments of the invention, the FPC has a plurality of sensors that consist of IC sensors.

According to some embodiments of the invention, an IC sensor is soldered to the FPC and then grinded to reduce its roof material.

According to some embodiments of the invention, a height of an IC sensor is reduced by heating.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

As will be appreciated by one skilled in the art, some embodiments of the present invention may be embodied as a system, method or computer program product. Accordingly, some embodiments of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, some embodiments of the present invention may take the form of a computer program product embodied in one or more computer readable medium(s) having computer readable program code embodied thereon. Implementation of the method and/or system of some embodiments of the invention can involve performing and/or completing selected tasks manually, automatically, or a combination thereof. Moreover, according to actual instrumentation and equipment of some embodiments of the method and/or system of the invention, several selected tasks could be implemented by hardware, by software or by firmware and/or by a combination thereof, e.g., using an operating system.

For example, hardware for performing selected tasks according to some embodiments of the invention could be implemented as a chip or a circuit. As software, selected tasks according to some embodiments of the invention could be implemented as a plurality of software instructions being executed by a computer using any suitable operating system. In an exemplary embodiment of the invention, one or more tasks according to some exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

Any combination of one or more computer readable medium(s) may be utilized for some embodiments of the invention. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium and/or data used thereby may be transmitted using any appropriate medium, including but not limited to wireless, wireline, optical fiber cable, RF, etc., or any suitable combination of the foregoing.

Computer program code for carrying out operations for some embodiments of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Some embodiments of the present invention may be described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Some of the methods described herein are generally designed only for use by a computer, and may not be feasible or practical for performing purely manually, by a human expert. A human expert who wanted to manually perform similar tasks, might be expected to use completely different methods, e.g., making use of expert knowledge and/or the pattern recognition capabilities of the human brain, which would be vastly more efficient than manually going through the steps of the methods described herein.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1:
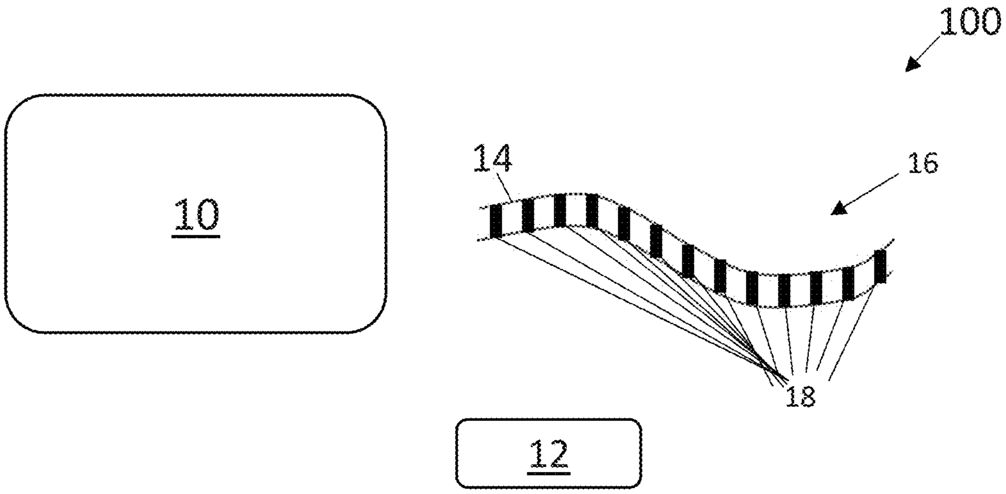
FIG. 1 is a schematic illustration of a system for shape sensing of an elongated flexible device, according to some embodiments of the invention.

The present disclosure, in some embodiments thereof, relates to Flexible Printed Circuits for elongated devices and, more particularly, but not exclusively, to Flexible Printed Circuits for elongated devices consisting of a series of links.

Overview

An aspect of some embodiments of the disclosure relates to methods and devices for in-vivo electromagnetic navigation. According to some embodiments, an endoscope may comprise a plurality of digital magnetometer sensors, for example integrated circuits (IC) sensors, which are assembled on a Flexible Printed Circuit (FPC) embedded inside an elongated interventional device, such as an endoscope.

In various embodiments of the present disclosure, the elongated FCB sensor is configured to be assembled on a flexible section of an elongated device, for example a medical interventional device, such as an endoscope. The elongated FCB sensor may include, for example, a shape sensor for sensing temporal shape and/or localization of the elongated device.

An aspect of some embodiments of the disclosure relates to embedding of electrical components, as well as a Flexible Printed Circuit (FPC), in an elongated flexible device. In some embodiments, a sensor array, which comprises discrete sensing elements, is assembled as an FPC or is assembled directly on the elongated device itself. In some embodiments, the FPC and/or conducting wires are wrapped helically inside a device's wall. In some embodiments, the device is an endoscope and the device's wall defines an endoscope's working channel. In some embodiments, the FPC and/or conducting wires are wrapped helically around the endoscope's working channel. In some embodiments, the assembly is then reflowed inside the device's wall or covered with polymer tube or polymer heat shrink tube. In some embodiments, components assembled along the length of the device are positioned such that they all lie on the same axis inside the device, or such that they lie linearly in groups. In some embodiments, assembled components can be further reflowed or glued or fixed by heat shrink tubing after being wrapped inside the device. In some embodiments, a potential advantage of reflowed or glued or fixed by heat shrink tubing is to potentially relieve strain on their soldering pads. In some embodiments, in the case of an endoscope, for example, the conductors or FPC may be longer than the length of the endoscope (for example, 1 meter longer) such that it extends from the endoscope's (or in general, the device's) proximal end to the endoscope's handle. In some embodiments, a potential advantage of helically winding the electronic circuit around a center of an elongated flexible device is to potentially preserve flexibility of the elongated device while providing electrical conductivity. In some embodiments, the FPC may be manufactured in many configurations, such as a straight long FPC, or as a spiral FPC, which is unpacked and wrapped in an assembly process. In some embodiments, the FPC optionally contains shielded conductors, for example, for a digital or analog endoscopic camera. In some embodiments, the camera's signals and EM sensing elements' signals may co-exist on the same FPC. In some embodiments, the FPC's distal end may further contain a camera. In some embodiments, the camera may be spatiality manipulated, such as through folding, and molded into the endoscope's tip as part of the assembly process. In some embodiments, the final assembly can optionally contain both camera and sensing elements (which can be SMT components) and are automatically assembled using, for example, Pick-and-Place machines. As used herein, the terms SMT (Surface Mount Technology) and SMD (surface-mount devices) are used as interchangeable terms, and they mean "the entire technology of mounting and soldering electronic components onto a FPC or PCB". In some embodiments, optionally, the FPC or conductors are automatically wrapped inside an endoscope using robotic assembly machines.

Before explaining at least one embodiment of the disclosure in detail, it is to be understood that the disclosure is not necessarily limited in its application to the details of construction and the arrangement of the components and/or methods set forth in the following description and/or illustrated in the drawings and/or the Examples. The disclosure is capable of other embodiments or of being practiced or carried out in various ways.

An aspect of some embodiments of the disclosure relates to providing an elongated flexible device and a method for embedding of electrical components, as well as a Flexible Printed Circuit (FPC) in an elongated flexible device.

In some embodiments of the present disclosure, the elongated flexible device includes a bendable/flexible tubular section made of rigid links, either metallic or non-metallic, for example laser-cut from a tubular raw material, or molded or manufactured in another method. The links may be connected in a series, for example with hinges, forming a bendable/flexible tubular section, for example with multiple bending points allowing it to bend.

Alternatively, the bendable tubular section may be created by removing material, for example by laser cutting, wire cutting, water jet cutting, EDM etc., from a long continuous tube, in a repeating pattern, to achieve a flexible tubular section.

Alternatively, the bendable/flexible tubular section may be created by casting, metal injection molding, polymer injection molding, or additive manufacturing technologies, to form a tubular section with openings and narrow bridges that allow different sections of the tubular section to deform and bend.

The flexible tubular section may contain areas where material is removed to provide space for the positioning of sensors during the assembly of the FPC onto the bendable section. Such removal of material may be achieved, for example, by laser cutting. In such methods, according to some embodiments, the sensors may be radially positioned inwardly in a wall of the link or of the bendable/flexible tubular section and/or inside the link or the bendable/flexible tubular section, thus maintaining and/or minimizing the overall thickness of the device, e.g. without increasing the device's outer diameter or reducing the device's inner diameter.

According to some embodiments of the present disclosure, each sensor is fixed to a link, with the FPC connecting the sensors between different links, providing a flexible electrical connection and maintaining the bending ability. In some embodiments. The FPC may be wrapped around the bendable section in a helix shape where the pitch of the helix is aligned with the size of the links.

In some embodiments, electrical components have thermal requirements. For example, the solder material requires high temperatures and specific thermal cycles during a soldering reflow process, while some components have limitations on the maximum temperatures they can withstand or the maximum time they can withstand certain temperatures, before damage of degradation occurs. In some embodiments, other processes, for example thermoplastic polymer reflow commonly used in steerable shaft manufacturing, have other thermal requirements, for example minimum temperatures and duration to allow proper flow of the polymer. In some embodiments, the polymer reflowed material and solder material are selected so that the reflow temperature of the polymer material is lower than the melting/soldering temperature of the solder material, which is in turn lower than the allowed temperature of the electrical components. In some embodiments, the electrical components are protected with a high melting-point material such as high temperature epoxy, to protect them and the soldering material during the polymer reflow process.

In some embodiments, wrapping an FPC over a bendable section creates a standalone subassembly of a bendable section with embedded sensor(s). Such subassembly can then be inserted into an external flexible protective tube, thus creating an endoscope without the need for an additional reflow process. This allows for a simple assembly process with lower cost. Additionally, such process eliminates the reheating of the electrical components, thus, for example, allowing a wider choice of components and materials. This configuration may also allow for some space between the links of the bendable section and the outer tube, allowing for the FPC to slide, so that a wider section of the FPC deforms, thus, for example, reducing the stresses developed in the FPC during bending.

In some embodiments the FPC is wrapped around the bendable section and around the working channel to create a standalone subassembly of a working channel with embedded sensor(s). This standalone subassembly can then be inserted into an external flexible protective tube that has a length similar to the length of the working channel of the device, or of the effective length of the device.

In some embodiments, the FPC is fixed to the bendable section or working channel in few specific points, for example at the distal and proximal ends of the bendable section of the working channel.

In other embodiments the FPC is fixed in more places, for example next to each sensor. The fixing can be done by applying a small drop of adhesive, by applying a narrow band of heat shrink around the sensors or any other applicable bonding method. A potential advantage of fixing the FPC to the bendable section or working channel is that the sensors position relative to nearby metallic components is then fixed, which may reduce electromagnetic interferences, for example in the case of electromagnetic sensors used for tracking the position or shape of the elongated device.

According to some embodiments of the present disclosure, it is advantageous for the incorporated IC sensors to be as small as possible in size, especially in thickness, to reduce their total height after being assembled on a FPC, for example to allow them to fit inside a thin endoscope of small outer diameter (for example, 3.5 mm of outer diameter). In some embodiments reducing the size or thickness of the incorporated IC allows them to fit in the openings created in the bendable section (whether it is made from links, laser cut, injection molding or any other method), without increasing the cross-sectional outer diameter of the overall assembly. These sensors can be digital magnetometer sensors, accelerometer sensors, gyroscope sensors, generic MEMS sensors, temperature sensors, pressure/stress sensors or any other kind of sensors which may be beneficial for certain endoscopic applications.

A method according to some embodiments of the present disclosure, includes a miniaturization process of sensors consisting of IC chips, herein referred to as IC sensor(s). An IC sensor may include a ball grid array (BGA) of certain dimensions, for example, of submillimeter width and height and of a certain thickness (for example, smaller than 0.5 mm). The IC sensor may be originally packaged in a wafer-level package, for example, a Wafer Level Chip Scale Package (WLCSP). According to the method provided herein, in some embodiments of the present disclosure, the IC sensor can be miniaturized to fit inside devices of small footprint, such as certain elongated devices, for example, a medical probe, an endoscope, a robotic endoscope, or any other suitable device. The miniaturization process can be manual, semi-automated or fully automated. The miniaturization process can be a post-manufacturing process, and can be combined in an FPC automated assembly pipeline.

Specifically, the methods provided in some embodiments of the present disclosure may be used to reduce thickness of a series of IC sensors assembled (or in the process of being assembled) on an elongated FCB sensor.

Reference is made to FIG. 1, which is a schematic illustration of a system 100 for shape sensing of an elongated flexible device 14, according to some embodiments of the present disclosure. In some embodiments, system 100 may include a processor 10, a transmitter 12 of electromagnetic fields, and a shape sensor 16, which may be installed on device 14. In some embodiments, device 14 may be deformed to various shapes, which may be sensed by shape sensor 16. In some embodiments, shape sensor 16 may be configured to sense in multiple locations along the device, a position and orientation, for example relative to transmitter 12, of each location. In some embodiments, EM shape sensor 16 includes an array of IC sensor elements 18, wherein a sensor 18 senses an electromagnetic field value, based on which locations and orientations and/or a shape of device 14 may be calculated, relative to location and orientation of EM transmitter 12. For example, a curve of device 14 is algorithmically fitted by processor 10, for example by calculating locations and orientations along device 14.

In some embodiments, IC sensors 18 of minimized height may be assembled on a FPC embedded inside an endoscope. In some embodiments, they can also be embedded inside any other suitable device, for example a device which requires a small footprint, such as, for example, a disposable stylet, needle, endoscopic tool etc.

In some embodiments, a sensor 18 may consist of a BGA, for example, a 4-BGA having four pads, which may be used for facilitating inter-integrated circuit communication by using four pads such as VCC, GND, and SCL, SDA for I2C communication. Sensor 18 may be packaged in wafer-level package such as WLCSP.

In some embodiments, the package size of IC sensor 18 may be reduced, for example by more than 30% or more than 50% of the total sensor thickness, or by more than 0.2 mm.

Figure 2:
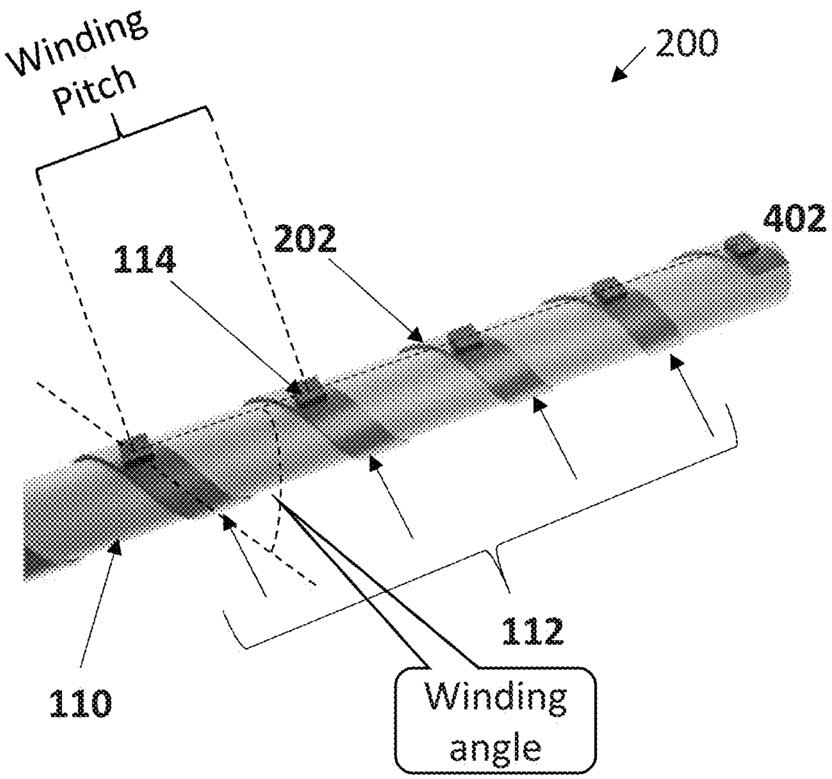
FIG. 2 is a schematic representation of an elongated device having a sensor array in a wound or helix geometrical configuration, according to some embodiments of the invention.

In some endoscopic configurations, it is potentially advantageous to use a helically wrapped FPC with sensors 18 to embed the sensors inside elongated flexible device 14, for example as depicted in FIG. 2. In some embodiments, sensors 18 may be assembled on the FPC, which may be helically wrapped around an elongated fixture of certain small diameter. For example, the FPC can be wrapped around an endoscope's working channel, such that the endoscope's mechanical features are not deteriorated by the embedding of the FPC. For example, in some configurations, the FPC may include a plurality of digital magnetometer sensors 18 (sensor ICs) which share a digital bus may be wrapped around the endoscope's working channel to embed these magnetometer sensors inside the endoscope's wall. These magnetometer sensors can then be used to provide full curve tracking of the endoscope, for example, for electromagnetic navigational bronchoscopy procedures.

Referring now to FIG. 2, showing a schematic representation of an elongated body 200 of flexible device 14 having a sensor array in a wound or helix geometrical configuration, according to some embodiments of the disclosure.

In some embodiments, an exemplary sensor array 112 is geometrically positioned in a wound or helix configuration, as schematically shown in FIG. 2. FIG. 2 shows an elongated device or elongated body 200 of the device, and a sensor array 112, which comprises the FPC 202 with a plurality of sensors 114.

In some embodiments, an exemplary FPC 202 is geometrically wrapped or bent over an elongated device 200 into a cylindrical shape.

In some embodiments, exemplary FPCs 202 are generated having specialized forms and/or geometries. In some embodiments, a rhombus-like pattern comprises central wide areas configured for receiving electrical components 114, and connected between them by one or more connecting bridges (not shown).

In some embodiments, a potential advantage of using the wrapping and winding methods disclosed herein is that it potentially overcomes the problems described herein. In some embodiments, the FPC is able to bend in all directions, surmounting the FPC's inability to stretch. In some embodiments, an FPC containing EM sensor array can sustain twisting about its own axis to create flexibility of the twisted FPC in all axes. In some embodiments, the rectangular cross section of the FPC allows the FPC to bend in one direction while making it stiffer in the perpendicular direction. In some embodiments, the FPC is embedded in an endoscope's wall or in a closed end catheter, such that the EM shape tracked catheter is steerable in all directions.

In some embodiments, a potential advantage of using the wrapping or winding methods disclosed herein is that it potentially allows for the control and minimization of the Cost of Goods Sold (COGS). For example, in some embodiments, using the wrapping or winding methods potentially contributive to a reduction in manual labor in the manufacturing and assembly of a tracked medical device, and thus to a significantly reduced COGS.

In some embodiments, as mentioned above, a potential advantage of using the wrapped or wound up FPC 202 is that it allows maneuvering the elongated device 200 to all directions since the FPC 202 itself can withstand the bending required when the elongated device is maneuvered.

In some embodiments, additionally or alternatively, a plurality of creases are added to the FPC 202 in connecting areas between soldered components. In some embodiments, a potential advantage of adding creases is that it potentially preserves the bending capabilities of the elongated device. In some embodiments, there can be one or more creases, and the creases can be in one or more of: a single axis, alternating axis, in 3D crease patterns, for example Kresling-pattern and/or for example as concertina-type hinge, such as found in the bendable section of drinking straws.

In some embodiments, the FPC 202 widens at dedicated locations, for example, at locations where electronic components 114 are positioned, to support the assembly of these components, and/or to provide enough space for FPC traces to bypass those components, and/or to improve mechanical support of the assembled components or for any other suitable reason.

In some embodiments, an exemplary endoluminal device 14 comprises an elongated body 200 and a handle (not shown) at a proximal end of body 200. In some embodiments, optionally, the elongated body comprises a working channel 110.

Sensor array 112 comprises a plurality of electrical components 114 (referred hereinafter just as "sensors 114"), for example sensors, capacitors, resistors, etc. It should be understood that over the following paragraphs, the term "sensors 114" refers to any electrical component 114 needed to be used on the sensor array 112. In some embodiments, the sensors 114 are spread along the elongated body 200.

Optionally, device 14 includes an additional sensor (not shown), for example an optical sensor and/or camera, located at a most distal end of the elongated body 200.

It should be understood that the sensor array 112 is not limited to a certain geometry or configuration, as will be further explained below. Additionally, components 114 are shown as squares, but it should be understood that the components can have any geometrical form: triangle, square, rectangle, etc.

In some embodiments, the sensors 114 are Electromagnetic sensors (EM sensors), and optionally, the sensors 114 are digital 3D magnetometers. In some embodiments, the sensor array 112 is configured for sensing position and/or shape of the elongated body 200.

In some embodiments, components 114 are assembled on both sides of the FPC. In some embodiments, components 114 and/or the additional sensor can be connected to any side of the FPC.

In some embodiments, as mentioned above, an exemplary sensor array 112 comprises an FPC 202 with a plurality of sensors 114. In the following paragraphs a specific example will be used to allow a person having skills in the art to understand the disclosure. The example is not intended to be limiting in any way. In some embodiments, the sensor array 112 is an EM shape sensor consisting of a plurality of discrete sensor elements, each of which may be for example a 3D digital magnetometer, assembled on a single FPC 202.

In some embodiments, in the case of digital magnetometers, all or some of them share a same digital bus inside the FPC 202. In some embodiments, a potential advantage of having all or some of the sensors on a same bus is that it potentially reduces the number of signals required on the FPC 202 to communicate with the plurality of sensor elements, for example, to as few as 1 signal. In some embodiments, an I2C (Inter-Integrated Circuit) or I3C (Improved Inter-Integrated Circuit) bus is used, which may require as few as 2 signals per bus (clock and data). In some embodiments, an additional 2 wires may be used to power the sensors (for example, voltage and ground). In some embodiments, the FPC 202 comprises of two layers. In some embodiments, one layer (for example, top layer) contains the assembled sensors and the second layer (for example, bottom layer) contains the data signals (for example, clock and data in case of an I2C bus). In some embodiments, each digital magnetometer may have 4 pads: voltage, ground, clock and data. In some embodiments, the power and ground signals may be laid out on the FPC 202 as two planes, for example on the top layer, to reduce resistance of power signals as well as to shield the data signals on the other layer.

In some embodiments, the FPC 202 comprises a length of for example >20 cm long, or >50 cm long, or >1 m long; and comprises a width of for example <2 mm or <1.5 mm or <1 mm. In some embodiments, the FPC 202 comprises a thickness of for example <0.13 mm or <0.1 mm. In some embodiments, the FPC 202 uses small copper weight per layer to increase its mechanical flexibility, for example, 0.5 oz copper. In some embodiments, optionally, the FPC 202 contains small holes, orifices or protrusions to allow the plastic materials to flow through the FPC 202 during a reflow process. In some embodiments, additionally or alternatively, it allows adhesive to flow during reflow process.

In some embodiments, as mentioned above, in order to maintain steerability of the final assembled device, the FPC 202 is wrapped helically inside the wall of the elongated device (e.g. endoscope), around the endoscope's working channel, as schematically shown for example in FIG. 2.

In some embodiments, components, for example the sensors 114, assembled along the length of the device, are positioned on the FPC 202 such that they all lie on the same axis, as schematically shown for example in FIG. 2, depicted by dashed line 402. In some embodiments, optionally, a discrete number of sensors 114 lie linearly in groups.

In some embodiments, optionally, the sensors 114 and other sensing elements/components are designed and assembled on the FPC with a rotation angle relative to the FPC axis, which corresponds to the winding angle of the FPC inside and/or on the elongated device. In some embodiments, for example, for a helix winding angle of $\theta=45°$, the discrete components can be designed and assembled with $-\theta=-45°$ rotation on the FPC relative to the FPC axis (which depends on the winding direction: clockwise vs. counter-clockwise). In some embodiments, the angle of positioning of the components in relation to the longitudinal axis of the FPC changes along the length of the FPC. In some embodiments, a potential advantage of changing the positioning angle of the components on the FPC is that it can be potentially used to match the changes in winding angle of the FPC along the length of the device. In some embodiments, optionally, providing angles to the components relative to the longitudinal axis of the FPC is done regardless of any present spiral or non-spiral configuration of the FPC. In some embodiments, a potential advantage of assembling the components with a rotation angle opposite to that of the winding angle is that it potentially ensures that the components are aligned in a straight line after winding (aligned with the device's axis), as schematically shown for example in FIG. 2. In some embodiments, a potential advantage of keeping the components aligned relative to the device is that it can potentially reduce the forces exerted on the components' soldered pads due to the tight winding of the FPC around the device, thus making the soldered sensor elements and other electrical components more resilient to bending of the device, for example, to withstand 20 mm bending radius, 15 mm bending radius, 10 mm bending radius or any other desired bending radius. In some embodiments, positioning components rotated compared to the axis of the FPC may require increasing the width of the FPC, which may negatively affect the mechanical properties of the device, for example, by increasing its stiffness. Therefore, in some embodiments of the present disclosure, the width of the FPC may change along its length, increasing near and around electrical components to support the assembly of rotated components and decreasing in gaps between components.

In some embodiments, the electrical components 114 positioned on the FPC 202 are positioned so as to occupy as little space as possible on the FPC 202. In some embodiments, a potential advantage of positioning the electrical components 114 so as for them to occupy as less space as possible on the FPC 202 is to potentially reduce the final footprint of the final elongated device, more specifically, the outer-diameter (OD) of the elongated device. In some embodiments, the sensor elements 114 (and other electrical elements such as SMT capacitors, resistors, integrated circuits, etc.) are placed on the FPC 202 such that after being wrapped in a helix they lie on the same axis, as schematically shown for example, in FIG. 2. In some embodiments, for a given winding angle θ, and a given winding radius R (the radius around which the FPC is to be wrapped), distances between the sensor elements 114 on the FPC 202 are computed. In some embodiments, the distances between the sensor elements change along the FPC to match the changing winding angle or radius of winding along the device's length. In some embodiments, a potential advantage of computing the distances between the electrical components is that it potentially guarantees that each sensor element is placed on the same axis after winding the sensor array on the device. For example, sensor elements 114 (and other components) are placed on the FPC 202 in increments of $2\pi R/\sin\theta$, where R is the winding radius and θ is the winding angle, as described above. In some embodiments, as mentioned herein elsewhere, the electrical components 114 are oriented on the FPC 202 in an angle opposite to the winding angle, such that, after being wrapped around the endoscope's working channel (elongated body 200), the electrical components 114 will occupy as little space as possible, and as well as to relieve the strain on their soldered pads. In some embodiments, as mentioned above, electrical components 114 may be non-square components, for example rectangular. In some embodiments, the non-square components are rotated at an angle so, after winding, they will have the minimal cross-section area. For example, a rectangular shaped component may be placed so that after winding its longer side is parallel to the longitudinal axis of the elongated device and its shorter side is parallel to the cross-section plane of the elongated device.

Figure 3:
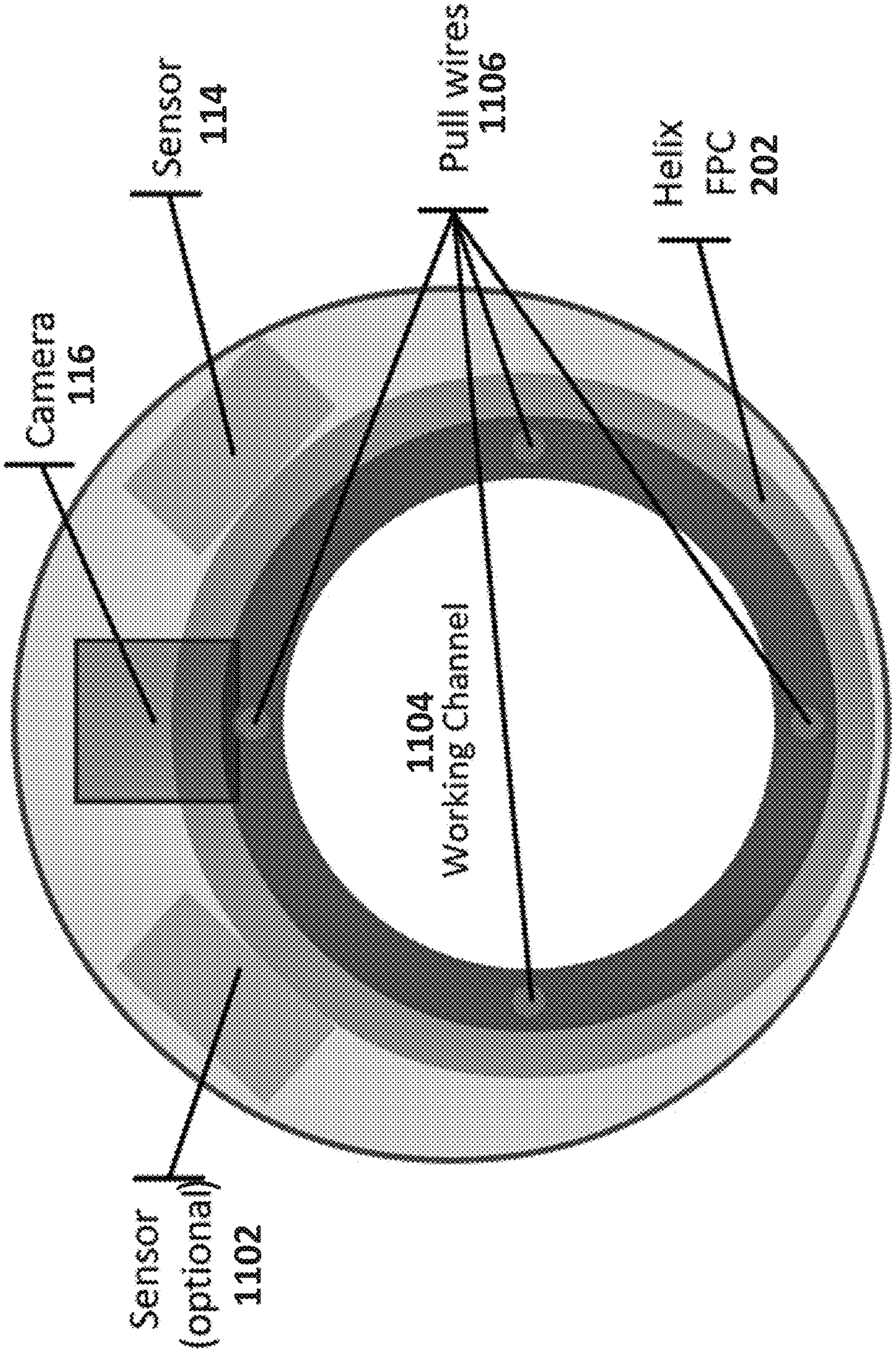
FIG. 3 is a schematic front view cross-section of an exemplary configuration of an exemplary elongated device, according to some embodiments of the invention.

Referring now to FIG. 3, showing a schematic front view cross-section of an exemplary configuration of an exemplary elongated device, according to some embodiments of the disclosure.

In some embodiments, the sensor elements 114 are positioned and oriented on the FPC 202, such that after being helically wrapped around the elongated body 104 that defines, for example, a working channel of an endoscope, the sensor elements 114 all lie on the same axis, for example, on a single axis out of the working channel 1104 and, optionally, aside to an optional camera 116 or an optional additional sensor 1102. In some embodiments, the longitudinal axis passing through the center of the elongated body 104 (for example the longitudinal axis passing through the center of the working channel) and the longitudinal axis of the overall resulting elongated device (comprising both the elongated body 104, the sensor array 112 and the external cover for the whole elongated device 100) are not coincident (are positioned with an offset between them). In some embodiments, a potential advantage of not coinciding the longitudinal axes is that it potentially leaves more space for the assembled components as well as for the optional camera 116/additional sensor 1102. In FIG. 3, it is also shown four embedded pull wires 1106 alongside with the assembled FPC, which can be advantageous for example for a robotically manipulated endoscope. In some embodiments, an electrical component, for example a sensor or a camera, are positioned in alignment to one of the two or more pull wires 1106. In some embodiments, a potential advantage of aligning between a sensor/camera and one of the two or more pull wires 1106 is that the input received from the sensor/camera is aligned with the bending directions of the elongated device. In some embodiments, electrical components are positioned, along the elongated body, between the two or more pull wires 1106. In some embodiments, a potential advantage of positioning electrical components between the two or more pull wires 1106 along the elongated device is that it potentially reduces the overall cross-sectional footprint of the elongated device. In some embodiments, the camera and sensors are all aligned in one line over one of the pull wires. In some embodiments, the camera and sensors are all aligned in the space between two pull wires. In some embodiments, the camera and sensors can be positioned in any other configuration along the elongated device and in relation to the two or more pull wires 1106.

It should be understood that while FIG. 3 shows a 4 pull-wire design, aligning components as disclosed above, can be done with 2 or more pull wires.

In some embodiments, the camera 116 and/or sensors 114 are located between two adjacent pull wires 1106.

Figure 4:
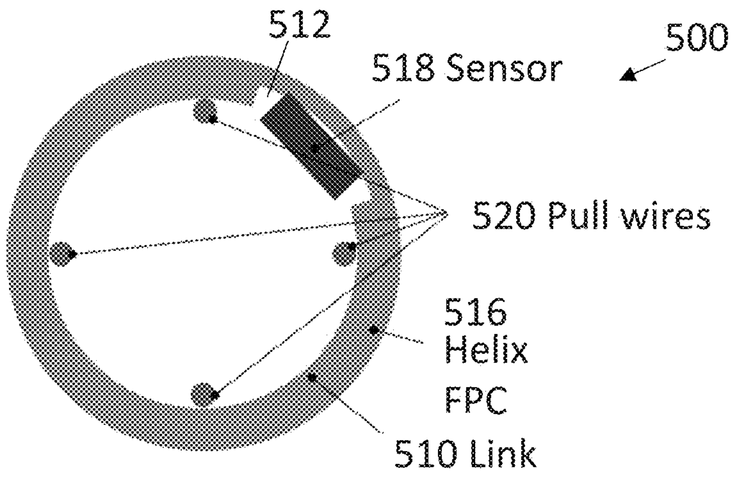
FIG. 4 is a cross-sectional schematic illustration of a bendable section with material removed to create space for a sensor to be inserted inwardly, according to some embodiments of the invention.
Figure 5:
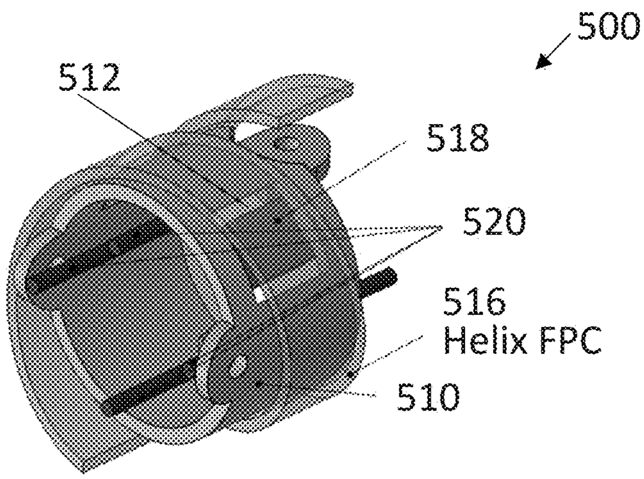
FIG. 5 is a schematic illustration of a link-designed bendable section with material removed to create space for a sensor to be inserted inwardly, according to some embodiments of the invention.

Reference is now made to FIG. 4, which is a cross-sectional schematic illustration of a bendable section 500 with material removed to create space for a sensor 518 to be inserted inwardly. Additionally, reference is made to FIG. 5, which is a schematic illustration of a link-designed bendable section 500 with material removed to create space for a sensor 518 to be inserted inwardly. While FIG. 5 shows a link-design bendable section it is to be understood that said bendable section can also be formed from a semi-rigid design with narrow areas that are designed to bend as mentioned above.

In some embodiments, bendable section 500 may be constructed of links 510. In this case links 510 may contain a groove/pocket or a window 512 for the positioning of sensors 518 during wrapping. In some embodiments, this may be achieved by opening a window 512, or making a groove or a pocket in a laser-cut link, or by adding a feature to the mold of a molded link to create a hole, a groove/pocket or a window 512 in the resulting part.

In some embodiments, FPC 516 is wrapped around links 510. For example, the pitch of the winding is aligned with the width of links 510 so each wind of FPC 516 extends along the length of one link 510. In other embodiments, the pitch may vary, for example so that the winding angle provides optimal mechanical performance. For example, there may be two winds per link 510, one wind every two links 510, two winds per every three links 510 or any other suitable ratio. In some embodiments, the links has a non-uniform width, for example some links are shorter than others. In this case the pitch of the FPC can be changed to match the changing width of the links with, for example, one sensor fixed to each link, one sensor fixed to every other link, two sensor fixed to each link etc. in some embodiments the number of sensors fixed to each link is not constant and may be related to the width of each link, for example one sensor can be fixed to links that are between 1.0 and 1.8 mm long, no sensors attached to links below 1 mm, and two sensors attached to links that are over 1.8 mm.

Figure 6A:
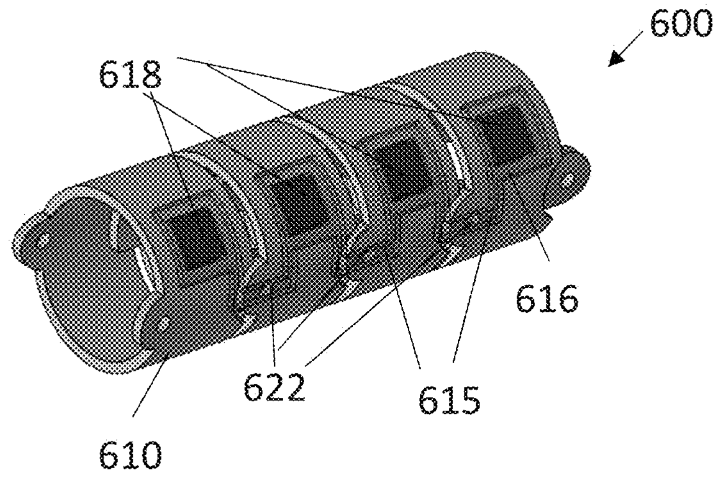
FIGS. 6A and 6B are schematic illustrations of a link-design bendable section with a FPC designed so that a plurality of conductors pass over hinges between links, according to some embodiments of the invention.

Reference is now made to FIG. 6A, which is a schematic illustration of a link-design bendable section 600 with FPC 616 designed so that a plurality of conductors 615 pass over hinges 622 between links 610.

In some embodiments, FPC 616 may be shaped in an "S" shape where sensors 618 are positioned in an offset from a plain of hinges 622, and FPC 616 is directed so that conductors 615 pass over hinges 622 between links 610. For example, this allows for FPC 616 to experience bending and not tension/compression, for example when the device/endoscope is deflected.

In other embodiments of the present disclosure, FPC 616 may have conductor sections 615 passing over hinges 622 on both sides of links 610, or on both sides of hinges 622, thus, for example, allowing for wider traces or larger number of traces between sensors 618. In some embodiments, conductors 615 may be split between the two sides, or may pass over the sides alternately, or any other suitable configuration.

Figure 6B:
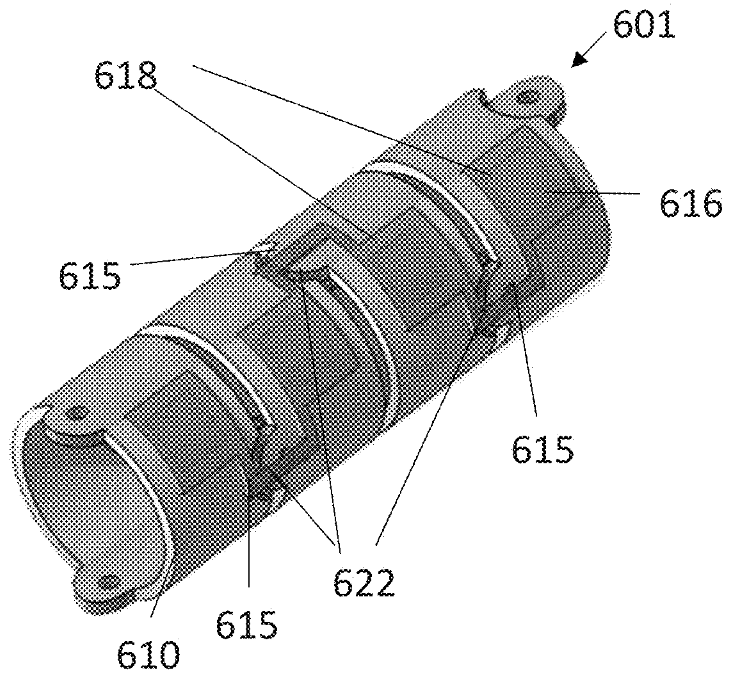

As shown in FIG. 6B, in some embodiments, bendable sections 600 may have by-plain bending abilities by having hinges 622 alternate between perpendicular plains. In some embodiments, the geometry of FPC 616 can be adjusted accordingly to maintain the positions of conductors 615, for example over hinges 622, for example, regardless of the hinge position.

In some embodiments, sensors 618 may be inserted inside links 610 of bendable section 600. For example, sensors 618 are positioned, at least partially, in a space between a working channel tube passing inside links 610 and the inner diameter of links 610.

Various embodiments of the present disclosure require small sensors 18 to fit inside certain devices. For example, in certain medical applications, specifically minimal invasive applications, devices of small footprint are inserted into the body to perform or assist in the performance of various medical procedures. Some devices contain one or more embedded sensors. For example, certain tracked devices, such as electromagnetically tracked devices, may contain one or more electromagnetic coils to enable localization of those devices for 3D guided procedures. Other devices may contain small IC sensors.

Figure 7A:
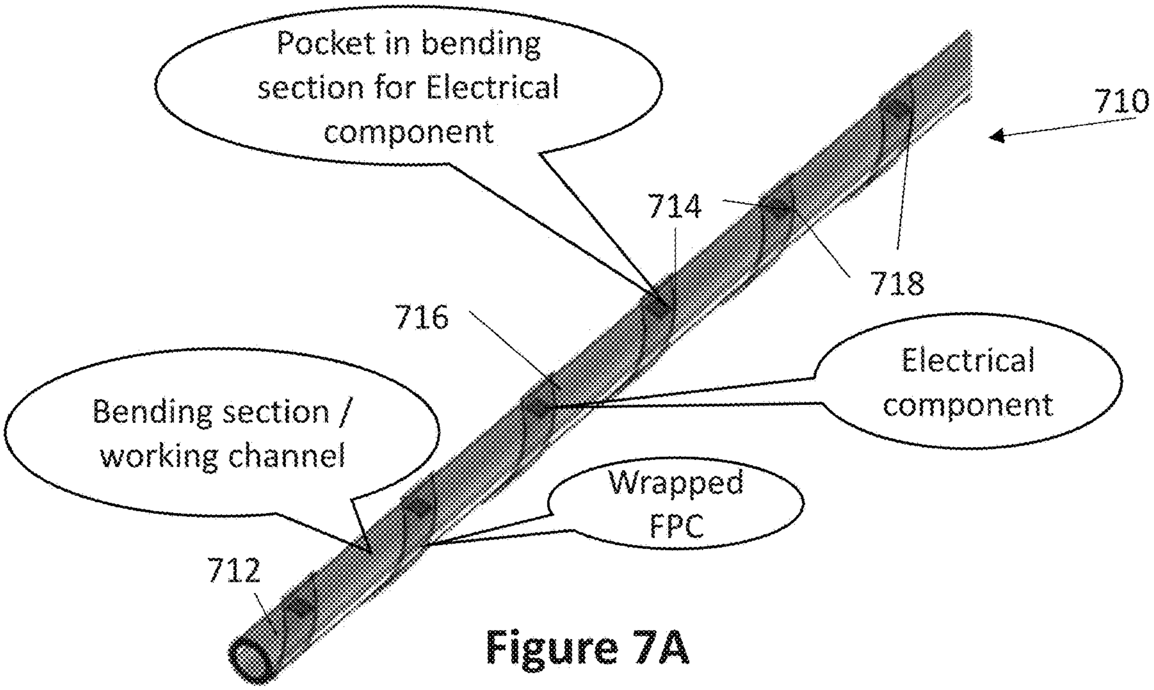
FIGS. 7A-7C are schematic illustrations of a standalone subassembly and an outer tube, according to some embodiments of the invention.
Figure 7B:
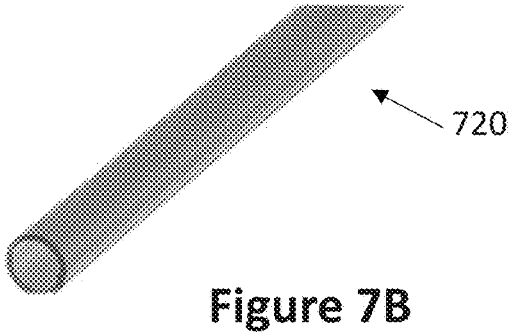
Figure 7C:
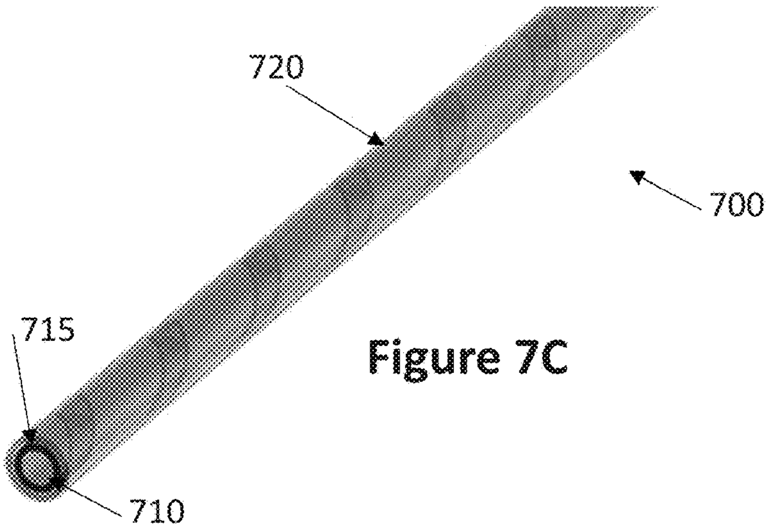

Reference is now made to FIGS. 7A-7C, which are schematic illustrations of a standalone subassembly 710 and an outer tube 720, according to some embodiments of the present disclosure. In some embodiments, where the FPC 714 is assembled on a bendable section 712 (that may be/include a working channel of an endoscope or another tool or device), as a standalone subassembly 710, and then inserted into an outer tube 720 as described herein, it is specifically advantageous to use lower height sensors or other electrical components 718, due to the added limitation on the crossing section of the standalone subassembly 710 to pass through the inner diameter of the outer tube 720. In this case the available cross-sectional footprint is even smaller compared to a device where, for example, the outer layer is reflowed over the sensors, in which case material can flow and fill gaps between sensors. When the standalone subassembly 710 is inserted into an outer tube 720 with fixed wall thickness and/or outer diameter, the outer diameter of the standalone subassembly 710 must be smaller than the outer diameter of outer tube 720 to meet the same overall device outer diameter. Therefore, a sensor/component 718 with a smaller height may be required.

In some embodiments, wrapping an FPC 714 over a bendable section 712 creates a standalone subassembly 710 of a bendable section with embedded sensor(s) 718. Such subassembly can then be inserted into an external flexible protective tube 720, thus creating, for example, an endoscope or another suitable device without the need for an additional reflow process. This allows for a simple assembly process with lower cost. Additionally, such process eliminates the reheating of the electrical components, thus, for example, allowing a wider choice of components and materials. This configuration may also allow for some space 715 between the standalone subassembly 710 and the outer tube 720, allowing for the FPC 714 to slide, so that a wider section of the FPC 714 deforms, thus, for example, reducing the stresses developed in the FPC during bending.

Figure 8:
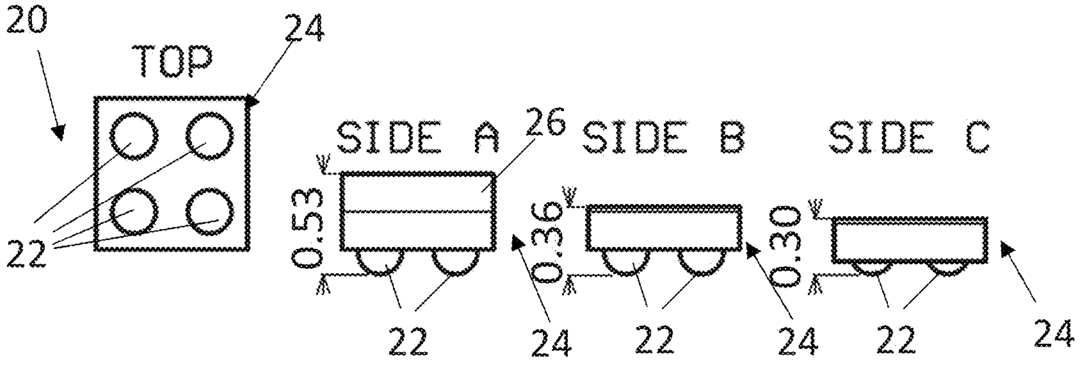
FIG. 8 is a schematic illustration of a BGA, included in a sensor described herein, and a thickness reducing process, according to some embodiments of the invention.

Reference is now made to FIG. 8, which is a schematic illustration of a BGA 20, included in a sensor 18 described herein, and a thickness reducing process, according to some embodiments of the present disclosure. In some embodiments, BGA 20 may include a substrate 24 and pads 22.

In some embodiments, a silicon substrate portion 26, covering functional components of sensor 18, sometimes called "the sensor's roof", may be grinded, for example in a post-manufacturing process and/or during the manufacturing process, for example to reduce the thickness of sensor 18 without hurting its functioning. In some embodiments, this is possible because the portion 26 of silicon substrate 24 does not contain logic of sensor 18. For example, portion 26 is a silicon layer which supports IC sensor 18 mechanically, but has no function in the operation of sensor 18. In some embodiments, sensor 18 may first be assembled (for example, soldered) on a FPC or PCB, manually or automatically in automated SMT assembly processes. After assembling sensor 18, for example, it may be potted with glue (for example, UV glue), according to some embodiments, to strengthen the sensor's attachment to the FPC. In some embodiments, the FPC can then be fixed and the sensor's roof 26 may be grinded, for example, using a rotary grinding tool, while sensor 18 is adhered by the soldered BGA bumps 22 and the glue to the fixed FPC.

In some embodiments, the grinding of sensor's roof 26 is controlled by a measuring tool, such as a caliper. Sensor's roof 26 can then be grinded for a certain amount of time, or by applying a certain amount of force with the grinding tool, or by certain number of pulses, or in any other suitable method. The caliper can be used in between applying the grinding to monitor the thickness of sensor 18, to achieve the desired target thickness of the grinded sensor 18.

In some embodiments, the grinding of roof 26 can be controlled visually, by an inspection camera which captures a live video of the sensor's grinding process. The camera can be placed sideways, so it captures the sensor's side view while being grinded. Using image processing algorithms, the grinded sensor's image can be analyzed, and the sensor's thickness can be computed, to provide indications for operator.

In some embodiments, the grinding process can be done automatically, by an automated grinding machine. For example, a grinding tool can be held by a robotic arm and the inspection camera can provide feedback for the robotic grinder to control the strength, duration, pulses or any other aspect of the grind process, to achieve a target thickness.

In another embodiment, the grinding process can be done automatically as an additional stage in the FPC automated assembly process pipeline. In this stage, a panel of assembled FPCs (which include the assembled IC sensors) may be inserted into a special grinding machine, for example, a manual or computer-controlled grinding machine. The machine will grind the panel of the assembled FPCs and may use visual inspection to monitor the grinding process, for example as described above. Alternatively, it may use accurate mechanical fixtures and jigs to ensure the grind of a certain accurate amount of the sensors' thickness, for example, to reduce the thickness of all assembled sensor ICs by 0.2 mm. The automated grinding machine may also automatically dispense glue on the sensor ICs prior to grinding, to strengthen their fixture to the FPC. The dispensing of glue may also take place in a prior automated process in the FPC assembly pipeline.

In another embodiment, the grinding process can be done at the wafer level, prior or after dicing (cutting the wafer into individual ICs).

In order to further reduce the total assembled sensor thickness on the FPC, in the case of a BGA sensor 18, the sensor's solder pads 22 (solder balls) can be reduced in height to achieve a reduced total height of the assembled sensor 18, as depicted in FIG. 1 (SIDE C). In FIG. 8, a side view of an original (not grinded) BGA 20 of sensor 18 is illustrated in "SIDE A", in which the total thickness of BGA 20 (including pads 22) is, for example, 0.53 mm. After grinding of the sensor's roof 26, the total height is reduced to, for example, 0.36 mm. After further reducing the BGA pads 22, the total height of BGA 20 is reduced to, for example, 0.3 mm, according to some embodiment of the present disclosure.

In some embodiments, the height of pads 22 can be reduced by placing soldering flux on pads 22 and then applying heating and brushing away pads 22 (for example, by using a soldering iron, a blower, a dedicated heating machine or by using any other suitable method). In the event that all solder is removed, smaller BGA pads 22 or solder material can be applied.

In some embodiments, the height of pads 22 can be reduced by removing the solder pads 22 (solder balls) with a soldering rework tool, and applying new solder in a smaller amount, or smaller BGA pads.

In some embodiments, the height of pads 22 can be reduced by placing smaller BGA pads at the wafer level process, before or after dicing.

As mentioned above, it is potentially advantageous to reduce the thickness of the assembled sensors 18 such that the helically wrapped FPC 30 would fit inside a thin endoscope of a small outer diameter, for example, of an outer diameter equal or smaller than 3.5 mm, smaller than 3.7 mm, smaller than 4.0 mm or smaller than 4.5 mm.

As described above, sensor ICs can be grinded after being assembled on the FPC. However, by potting the sensors with glue on a flat FPC (before wrapping the FPC), the glue forces a flat shape in the proximity of the sensors, and it will then be difficult to helically wrap the FPC inside an elongated device such as an endoscope. To avoid that, according to some embodiments of the present disclosure, the sensors are first assembled on the flat FPC in standard manual or automated assembly processes. These sensors may include reduced pads 20, such that they are assembled lower on the FPC due to their reduced pads. The assembled FPC is then wrapped helically inside the elongated device, for example an endoscope, or around an elongated fixture which is similar in dimensions to the final wrapping dimension needed for that FPC. The sensors are then potted with glue, such that the glue dries and fixes the FPC in its desired curved shape. Grinding process, for example to eliminate or reduce the roof 26, is then performed on the assembled and glued sensor ICs as described above. The wrapped FPC can then be optionally pulled from the elongated fixture and assembled on the final elongated structure, for example, wrapped around an endoscope's working channel while maintaining its helical shape due to the curved dried glue points.

By grinding the sensors while being assembled helically around an elongated device, the sensors can be fixed (by solder and glue) in their curved positions so that the grinding process and the applied forces do not detach them from their soldered positions on the curves FPC.

While throughout the disclosure focus is given to the winding of FPC around medical devices to enable EM shape sensing in the field of endoscopes and catheters, it should be appreciated that similar application may enable any sensing in any other elongated flexible device. For example, an FPC containing sensor-array can be embedded in a helical manner inside an elongated device for general use, for example, in a VR/AR tracked wire for training or simulations, or for example in a robotic arm and its control mechanisms. Additional examples of sensors that may be similarly integrated into a device using such methods are for example imaging sensors, thermometers, flow meters such as velocimeters and others, ultrasonic transducers and receivers, radiation emitters and radiation detectors, pressure and strain sensors, piezoelectric or other force sensors, and other types of sensors.

As used herein with reference to quantity or value, the term "about" means "within +20% of".

The terms "comprises", "comprising", "includes", "including", "has", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular forms "a", "an" and "the" include plural references unless the context clearly dictates otherwise. For example, the term "a compound" or "at least one compound" may include a plurality of compounds, including mixtures thereof.

Throughout this application, embodiments of this invention may be presented with reference to a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as "from 1 to 6" should be considered to have specifically disclosed subranges such as "from 1 to 3", "from 1 to 4", "from 1 to 5", "from 2 to 4", "from 2 to 6", "from 3 to 6", etc.; as well as individual numbers within that range, for example, 1, 2, 3, 4, 5, and 6. This applies regardless of the breadth of the range.

Whenever a numerical range is indicated herein (for example "10-15", "10 to 15", or any pair of numbers linked by these another such range indication), it is meant to include any number (fractional or integral) within the indicated range limits, including the range limits, unless the context clearly dictates otherwise. The phrases "range/ranging/ranges between" a first indicate number and a second indicate number and "range/ranging/ranges from" a first indicate number "to", "up to", "until" or "through" (or another such range-indicating term) a second indicate number are used herein interchangeably and are meant to include the first and second indicated numbers and all the fractional and integral numbers therebetween.

Unless otherwise indicated, numbers used herein and any number ranges based thereon are approximations within the accuracy of reasonable measurement and rounding errors as understood by persons skilled in the art.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It is the intent of the applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. An elongated device, comprising:

a plurality of serially connected links, forming a bendable section; and a flexible printed circuit (FPC) having at least one sensor attached therein, the FPC is assembled on the links across the bendable section;

wherein hinges between the links alternate between perpendicular plains.

2. The elongated device of claim 1, wherein the links include a window to allow the sensor to be inserted inwardly into a corresponding link.

3. The elongated device of claim 1, wherein the links are serially connected by hinges.

4. The elongated device of claim 1, wherein the FPC is wrapped on the bendable section so that the at least one sensor is positioned on a corresponding link.

5. The elongated device of claim 1, wherein the FPC include a plurality of sensors along the FPC, and the FPC is installed on the bendable section so that the plurality of sensors are aligned on a straight line.

6. The elongated device of claim 1, wherein the FPC include a plurality of sensors along the FPC, and the FPC is installed on the bendable section so that the plurality of sensors are inserted to windows in corresponding links of the bendable section.

7. The elongated device of claim 1, wherein the links of the bendable section are formed by removing material from a tube.

8. The elongated device of claim 1, wherein a pitch of winding of the FPC is a link length or a multiple of a link length.

9. The elongated device of claim 1, wherein the FPC comprises conductors that pass over hinges between the links.

10. The elongated device of claim 1, wherein the FPC has a plurality of sensors that are positioned in an offset from a plain of hinges between the links.

11. The elongated device of claim 1, wherein the FPC has a plurality of sensors that consist of Integrated Circuit (IC) sensors.

12. The elongated device of claim 11, wherein an Integrated Circuit (IC) sensor is soldered to the FPC and then grinded to reduce its roof material.

13. The elongated device of claim 11, wherein a height of an Integrated Circuit (IC) sensor is reduced by heating.

14. An elongated device, comprising:

a standalone subassembly comprising:

a bendable section;

a flexible printed circuit (FPC) having at least one sensor attached therein, the FPC is assembled across the bendable section; and an outer tube in which the standalone subassembly is threaded;

wherein hinges between the links alternate between perpendicular plains.

15. The elongated device of claim 14, wherein the bendable section includes a window to allow the sensor to be inserted inwardly into the bendable section.

16. The elongated device of claim 14, wherein the bendable section includes serially connected links, wherein the FPC is assembled on the links across the bendable section.

17. The elongated device of claim 16, wherein the bendable section consists of links serially connected by hinges.

18. The elongated device of claim 16, wherein the FPC is wrapped on the bendable section so that the at least one sensor is positioned on a corresponding link.

19. The elongated device of claim 16, wherein a pitch of winding of the FPC is a link length or a multiple of a link length.

20. The elongated device of claim 16, wherein the FPC comprises conductors that pass over hinges between the links.

21. The elongated device of claim 16, wherein the FPC has a plurality of sensors that are positioned in an offset from a plain of hinges between the links.

22. The elongated device of claim 14, wherein the FPC include a plurality of sensors along the FPC, and the FPC is installed on the bendable section so that the plurality of sensors are aligned on a straight line.

23. The elongated device of claim 14, wherein the FPC include a plurality of sensors along the FPC, and the FPC is installed on the bendable section so that the plurality of sensors are inserted to windows in of the bendable section.

24. The elongated device of claim 14, wherein the links of the bendable section are formed by removing material from a tube.

25. The elongated device of claim 14, wherein the FPC has a plurality of sensors that consist of Integrated Circuit (IC) sensors.

26. The elongated device of claim 14, wherein an Integrated Circuit (IC) sensor is soldered to the FPC and then grinded to reduce its roof material.

27. The elongated device of claim 14, wherein a height of an Integrated Circuit (IC) sensor is reduced by heating.

* * * * *